(12) United States Patent
Tang

(10) Patent No.: US 10,707,855 B2
(45) Date of Patent: Jul. 7, 2020

(54) PULSE MODULATION CIRCUIT WITH HIGH-FREQUENCY-LIMITING FUNCTION

(71) Applicant: Chongqing Passion Chuangzhi Microelectronics Co., LTD., Chongqing (CN)

(72) Inventor: Fang Tang, Chongqing (CN)

(73) Assignee: CHONGQING PASSION CHUANGZHI MICROELECTRONICS CO., LTD., Chongqing (CN)

( * ) Notice: Subject to any disclaimer, the term of this patent is extended or adjusted under 35 U.S.C. 154(b) by 0 days.

(21) Appl. No.: 16/455,652

(22) Filed: Jun. 27, 2019

(65) Prior Publication Data

US 2020/0007117 A1 Jan. 2, 2020

(30) Foreign Application Priority Data

Jun. 27, 2018 (CN) .......................... 2018 1 0674946

(51) Int. Cl.
*H03K 3/017* (2006.01)
*H03K 7/06* (2006.01)
*H03K 3/037* (2006.01)
*H03K 19/20* (2006.01)

(52) U.S. Cl.
CPC ............... *H03K 7/06* (2013.01); *H03K 3/037* (2013.01); *H03K 19/20* (2013.01)

(58) Field of Classification Search
CPC ............ H03K 7/06; H03K 7/08; H03K 3/017; H03K 3/037; H03K 3/284; H03K 5/04; H03K 5/05; H03K 5/1565; H03K 19/20
See application file for complete search history.

(56) References Cited

U.S. PATENT DOCUMENTS

2019/0260280 A1* 8/2019 Yao .......................... H02M 1/14

* cited by examiner

*Primary Examiner* — Long Nguyen
(74) *Attorney, Agent, or Firm* — Bayramoglu Law Offices LLC

(57) ABSTRACT

A pulse modulation circuit with a high-frequency-limiting function, including a comparator, an RS trigger, a switching triode, a NAND gate, a NOR gate, and a charging capacitor. A capacitor charging time is controlled by adjusting a bias current IB1, a bias current IB2, a reference voltage V1, and a reference voltage V2 or adjusting values of capacitors C1 and C2. In this way, a highest output frequency of a pulse generator is limited, so as to reduce hardware system overheads.

5 Claims, 1 Drawing Sheet

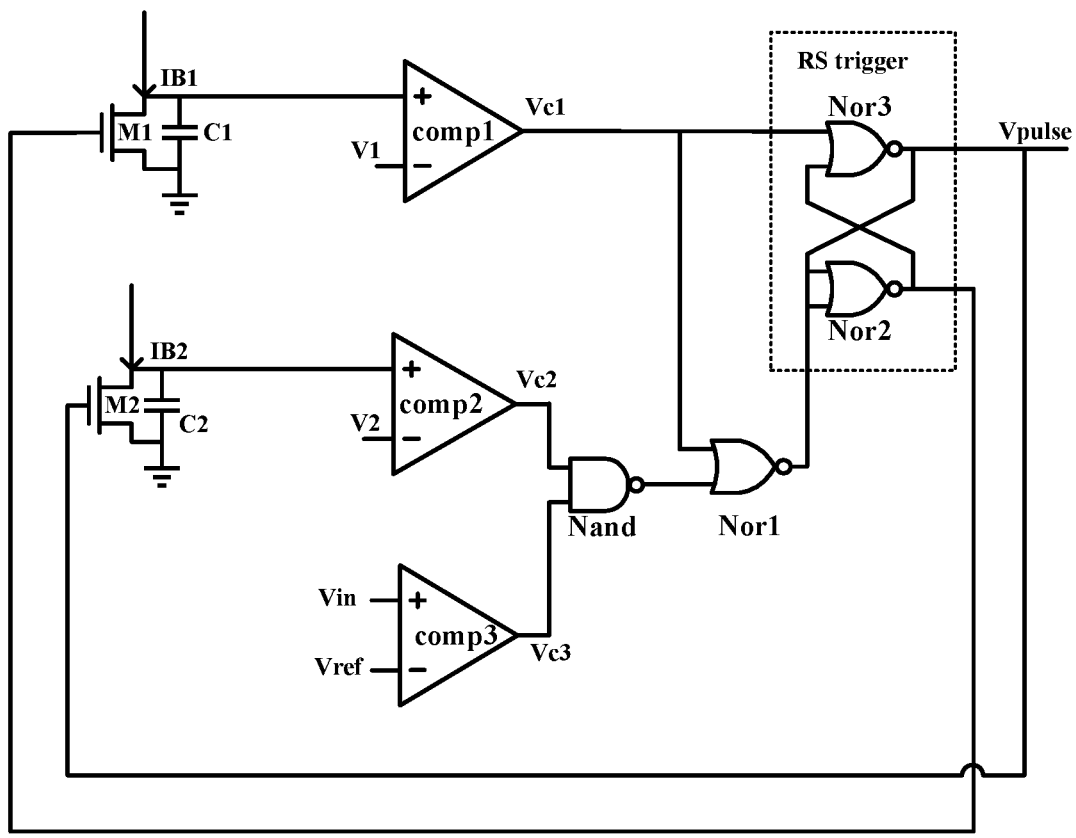

PULSE MODULATION CIRCUIT WITH HIGH-FREQUENCY-LIMITING FUNCTION

CROSS REFERENCE TO THE RELATED APPLICATIONS

The present application is based on and claims priority to the Chinese patent application 201810674946.4, filed on Jun. 27, 2018, the entire contents of which are incorporated herein by reference.

TECHNICAL FIELD

The present invention belongs to the field of integrated circuit design technologies, and more specifically, relates to a pulse modulation circuit with a high-frequency-limiting function.

BACKGROUND

A conventional pulse generating circuit is actually a comparator. A working principle thereof is that an input signal Vin is compared with a reference voltage Vref; and when Vin>Vref, 1 is output; otherwise, 0 is output. In this way, a periodic triangular wave signal is converted to a pulse signal. In some application, considering hardware system overheads, a quite high frequency pulse is not required. Therefore, a frequency of a pulse generating circuit needs to be limited. However, at present, there is no pulse generating circuit for limiting a highest frequency.

SUMMARY

The present invention aims to resolve at least one technical problem in a related technology to some extent. Therefore, a main objective of the present invention is to provide a pulse modulation circuit with a high-frequency-limiting function, to resolve a problem that a frequency of a conventional pulse generating circuit is excessively high.

The objective of the present invention is implemented through the following technical solution: A pulse modulation circuit with a high-frequency-limiting function, including a first level output unit, a second level output unit, a voltage comparator comp3, an RS trigger, a NAND gate, and a NOR1 gate, where an output terminal of the first level output unit is connected to an input terminal of the RS trigger and an input terminal of the NOR1 gate, and an input terminal of the first level output unit is connected to an output terminal of the RS trigger;

an output terminal of the second level output unit is connected to an input terminal of the NAND gate, and an input terminal of the second level output unit is connected to another output terminal of the RS trigger and a voltage pulse frequency output terminal; and another input terminal of the NAND gate is connected to an output terminal of the voltage comparator comp3, and an output terminal of the NAND gate is connected to another input terminal of the NOR1 gate; and two input terminals of the voltage comparator comp3 are connected to a periodic input signal Vin and a reference signal Vref, respectively.

Further, the first level output unit includes a switching triode M1, a charging capacitor C1, and a voltage comparator comp1;

a gate electrode of the switching triode M1 is connected to an output terminal of the RS trigger, a drain electrode of the switching triode M1 is grounded, a source electrode of the switching triode M1 is connected to an input terminal of the voltage comparator comp1, and a bias current IB1 is input to the source electrode of the switching triode M1;

two electrodes of the charging capacitor C1 are connected to the drain electrode and the source electrode of the switching triode M1, respectively; a reference voltage V1 is input to another input terminal of the voltage comparator comp 1; and an output terminal of the voltage comparator comp 1 is connected to an input terminal of the RS trigger and an input terminal of the NOR1 gate.

Further, the second level output unit includes a switching triode M2, a charging capacitor C2, and the voltage comparator comp2;

a gate electrode of the switching triode M2 is connected to an output terminal of the RS trigger and the voltage pulse frequency output terminal, a drain electrode of the switching triode M2 is grounded, a source electrode of the switching triode M2 is connected to an input terminal of the voltage comparator comp2, and a bias current IB2 is input to the source electrode of the switching triode M2;

two electrodes of the charging capacitor C2 are connected to the drain electrode and the source electrode of the switching triode M2, respectively; a reference voltage V2 is input to another input terminal of the voltage comparator comp2; and an output terminal of the voltage comparator comp2 is connected to an input terminal of the NAND gate.

Further, the periodic input signal Vin and the reference signal Vref are compared by using the comparator to obtain a periodic pulse signal Vc3; C1 and C2 are charging capacitors, and when a voltage of C1 and a voltage of C2 are greater than V1 and V2, respectively, output results Vc1 and Vc2 of the comparator change to 1; and when Vc1 is 1, Vpulse is 0, if one of Vc2 and Vc3 is not 1, the triode M1 is switched on, the triode M2 is switched off C1 performs discharging, C2 is continuously charged, and Vpulse changes to 1 from 0 until both Vc2 and Vc3 are 1; and a periodic signal Vpulse is obtained based on charging and discharging processes of C1 and C2; and if a charging time of C1 and a charging time of C2 are T1 and T2, respectively, a period of Vpulse is T1+T2.

Further, a frequency of the input signal yin is excessively high, a highest frequency of an output signal is controlled by adjusting the bias current IB1, the bias current IB2, the reference voltage V1, and the reference voltage V2 or adjusting values of the capacitors C1 and C2.

Compared with the prior art, the present invention at least has the following advantages:

If a frequency of an input signal Vin is excessively high, a highest frequency of an output signal can be controlled by adjusting a bias current IB1, a bias current IB2, a reference voltage V1, and a reference voltage V2 or adjusting values of capacitors C1 and C2. In this way, a highest output frequency of a pulse generator is limited, so as to reduce hardware system overheads.

BRIEF DESCRIPTION OF THE DRAWINGS

To describe the technical solutions in the embodiments of the present invention or in the prior art more clearly, the following briefly describes the accompanying drawings required for describing the embodiments or the prior art. Apparently, the accompanying drawings in the following description show some embodiments of the present invention, and a person of ordinary skill in the art may still derive other drawings from these accompanying drawings without creative efforts.

FIG. 1 is a structural schematic diagram of a pulse modulation circuit with a high-frequency-limiting function in the present invention.

DETAILED DESCRIPTION OF THE EMBODIMENTS

The following clearly and completely describes the technical solutions in the embodiments of the present invention with reference to the accompanying drawings in the embodiments of the present invention. Apparently, the described embodiments are merely a part rather than all of the embodiments of the present invention.

All other embodiments obtained by a person of ordinary skill in the art based on the embodiments of the present invention without creative efforts shall fall within the protection scope of the present invention. All other embodiments obtained by a person of ordinary skill in the art based on the embodiments of the present invention without creative efforts shall fall within the protection scope of the present invention.

It should be noted that all the directional indications (such as upper, lower, left, right, front, back, etc.) in the embodiments of the present invention are merely used to explain a relative position relationship, motion situations, and the like of the components in a specific gesture (as shown in the figures). If the specific gesture changes, the directivity indication also changes accordingly.

Moreover, the terms such as "first", "second", and the like described in the present invention are used herein only for the purpose of description and are not intended to indicate or imply relative importance, or implicitly indicate the number of the indicated technical features. Therefore, features defined by "first" and "second" may explicitly or implicitly include at least one of the features.

In description of the present invention, "a plurality of" means at least two, for example, two or three, unless otherwise clearly and specifically limited.

In the present invention, unless otherwise clearly specified and limited, meanings of terms "connection", "fastening", and the like should be understood in a board sense. For example, "connection" may be a fixed connection, a removable connection, or integration; may be a mechanical connection or an electrical connection; may be a direct connection or an indirect connection implemented by using an intermediate medium; or may be intercommunication between two components or an interaction relationship between two components, unless otherwise clearly limited. A person of ordinary skill in the art may understand specific meanings of the foregoing terms in the present invention based on a specific situation.

Furthermore, the technical solutions between the various embodiments of the present invention may be combined with each other, but must be on the basis that the combination thereof can be implemented by a person of ordinary skill in the art. In case of a contradiction with the combination of the technical solutions or a failure to implement the combination, it should be considered that the combination of the technical solutions does not exist, and is not within the protection scope of the present invention.

Embodiment 1

As shown in FIG. 1, FIG. 1 shows a pulse modulation circuit with a high-frequency-limiting function, which includes a first level output unit, a second level output unit, a voltage comparator comp3, an RS trigger, a NAND gate, and a NOR1 gate.

An output terminal of the first level output unit is connected to an input terminal of the RS trigger and an input terminal of the NOR1 gate, and an input terminal of the first level output unit is connected to an output terminal of the RS trigger.

An output terminal of the second level output unit is connected to an input terminal of the NAND gate, and an input terminal of the second level output unit is connected to another output terminal of the RS trigger and a voltage pulse frequency output terminal; and another input terminal of the NAND gate is connected to an output terminal of the voltage comparator comp3, and an output terminal of the NAND gate is connected to another input terminal of the NOR1 gate.

Two input terminals of the voltage comparator comp3 are connected to a periodic input signal Vin and a reference signal Vref, respectively.

The first level output unit includes a switching triode M1, a charging capacitor C1, and a voltage comparator comp1.

A gate electrode of the switching triode M1 is connected to an output terminal of the RS trigger, a drain electrode of the switching triode M1 is grounded, a source electrode of the switching triode M1 is connected to an input terminal of the voltage comparator comp1, and a bias current IB1 is input to the source electrode of the switching triode M1.

Two electrodes of the charging capacitor C1 are connected to the drain electrode and the source electrode of the switching triode M1, respectively; a reference voltage V1 is input to another input terminal of the voltage comparator comp1; and an output terminal of the voltage comparator comp1 is connected to an input terminal of the RS trigger and an input terminal of the NOR1 gate.

The second level output unit includes a switching triode M2, a charging capacitor C2, and the voltage comparator comp2.

A gate electrode of the switching triode M2 is connected to an output terminal of the RS trigger and the voltage pulse frequency output terminal, a drain electrode of the switching triode M2 is grounded, a source electrode of the switching triode M2 is connected to an input terminal of the voltage comparator comp2, and a bias current IB2 is input to the source electrode of the switching triode M2.

Two electrodes of the charging capacitor C2 are connected to the drain electrode and the source electrode of the switching triode M2, respectively; a reference voltage V2 is input to another input terminal of the voltage comparator comp2; and an output terminal of the voltage comparator comp2 is connected to an input terminal of the NAND gate.

The periodic input signal Vin and the reference signal Vref are compared by using the comparator to obtain a periodic pulse signal Vc3; C1 and C2 are charging capacitors, and when a voltage of C1 and a voltage of C2 are greater than V1 and V2, respectively, output results Vc1 and Vc2 of the comparator change to 1; and when Vc1 is 1, Vpulse is 0, if one of Vc2 and Vc3 is not 1, the triode M1 is switched on, the triode M2 is switched off, C1 performs discharging, C2 is continuously charged, and Vpulse changes to 1 from 0 until both Vc2 and Vc3 are 1.

A periodic signal Vpulse is obtained based on charging and discharging processes of C1 and C2; and if a charging time of C1 and a charging time of C2 are T1 and T2, respectively, a period of Vpulse is T1+T2.

A frequency of the input signal Vin is excessively high, a highest frequency of an output signal is controlled by adjusting the bias current IB1, the bias current IB2, the reference voltage V1, and the reference voltage V2 or adjusting values of the capacitors C1 and C2.

The above merely describes specific embodiments of the present invention, but the protection scope of the present invention is not limited thereto. A person skilled in the art can easily conceive modifications or replacements within the technical scope of the present invention, and these modifications or replacements shall fall within the protection scope of the present invention. Therefore, the protection scope of the present invention should be subject to the protection scope of the claims.

What is claimed is:

1. A pulse modulation circuit with a high-frequency-limiting function,
    comprising: a first level output unit, a second level output unit, a third voltage comparator, an RS trigger, a NAND gate, and a NOR gate, wherein
    an output terminal of the first level output unit is connected to a first input terminal of the RS trigger and a first input terminal of the NOR gate, and an input terminal of the first level output unit is connected to a first output terminal of the RS trigger;
    an output terminal of the second level output unit is connected to a first input terminal of the NAND gate, and an input terminal of the second level output unit is connected to a second output terminal of the RS trigger and a voltage pulse frequency output terminal; and a second input terminal of the NAND gate is connected to an output terminal of the third voltage comparator, and an output terminal of the NAND gate is connected to a second input terminal of the NOR gate; and
    two input terminals of the third voltage comparator are connected to a first periodic input signal and a first reference signal, respectively.

2. The pulse modulation circuit with the high-frequency-limiting function according to claim 1, wherein the first level output unit comprises a first switching triode, a first charging capacitor, and a first voltage comparator;
    a gate electrode of the first switching triode is connected to the first output terminal of the RS trigger, a drain electrode of the first switching triode is grounded, a source electrode of the first switching triode is connected to a first input terminal of the first voltage comparator, and a first bias current is input to the source electrode of the first switching triode;
    two electrodes of the first charging capacitor are connected to the drain electrode and the source electrode of the first switching triode, respectively; a first reference voltage is input to a second input terminal of the first voltage comparator; and an output terminal of the first voltage comparator is connected to the first input terminal of the RS trigger and the first input terminal of the NOR gate.

3. The pulse modulation circuit with the high-frequency-limiting function according to claim 2, wherein the second level output unit comprises a second switching triode, a second charging capacitor, and a second voltage comparator;
    a gate electrode of the second switching triode is connected to the second output terminal of the RS trigger and the voltage pulse frequency output terminal, a drain electrode of the second switching triode is grounded, a source electrode of the second switching triode is connected to a first input terminal of the second voltage comparator, and a second bias current is input to the source electrode of the second switching triode;
    two electrodes of the second charging capacitor are connected to the drain electrode and the source electrode of the second switching triode, respectively; a second reference voltage is input to a second input terminal of the second voltage comparator; and an output terminal of the second voltage comparator is connected to the second input terminal of the NAND gate.

4. The pulse modulation circuit with the high-frequency-limiting function according to claim 3, wherein the first periodic input signal and the first reference signal are compared by using the third voltage comparator to obtain a second periodic pulse signal; the first charging capacitor and the second charging capacitor are charging capacitors, and when a voltage of the first charging capacitor and a voltage of the second charging capacitor are greater than the first reference voltage and the second reference voltage, respectively, an output of the first voltage comparator and an output of the second voltage comparator change to 1; and when the output of the first voltage comparator is 1, a voltage pulse signal (Vpulse) at the voltage pulse frequency output terminal is 0, when one of the output of the second voltage comparator or an output of the third voltage comparator is not 1, the first switching triode is switched on, the second switching triode is switched off, the first charging capacitor performs discharging, the second charging capacitor is continuously charged, and the voltage pulse signal (Vpulse) changes to 1 from 0 until both of the output of the second voltage comparator and the output of the third voltage comparator are 1; and
    the voltage pulse signal (Vpulse) is obtained based on charging and discharging processes of the first charging capacitor and the second charging capacitor; and when a charging time of the first charging capacitor and a charging time of the second charging capacitor are T1 and T2, respectively, a period of the Vpulse is T1+T2.

5. The pulse modulation circuit with the high-frequency-limiting function according to claim 4, wherein a frequency of the first periodic input signal is excessively high, a highest frequency of an output signal is controlled by adjusting the first bias current, the second bias current, the first reference voltage, and the second reference voltage or adjusting values of the first charging capacitor and the second charging capacitor.

* * * * *